(12) United States Patent
Furuichi

(10) Patent No.: US 9,266,234 B2
(45) Date of Patent: Feb. 23, 2016

(54) TRANSFER ROBOT AND SUBSTRATE PROCESSING APPARATUS

(75) Inventor: Masatoshi Furuichi, Fukuoka (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 764 days.

(21) Appl. No.: 13/568,622

(22) Filed: Aug. 7, 2012

(65) Prior Publication Data

US 2013/0078060 A1    Mar. 28, 2013

(30) Foreign Application Priority Data

Sep. 26, 2011    (JP) ................................. 2011-209876

(51) Int. Cl.
| | | |
|---|---|---|
| *H01L 21/683* | (2006.01) | |
| *B25J 9/04* | (2006.01) | |
| *H01L 21/677* | (2006.01) | |
| *B25J 18/04* | (2006.01) | |

(52) U.S. Cl.
CPC ........ *B25J 9/042* (2013.01); *B25J 18/04* (2013.01); *H01L 21/67766* (2013.01)

(58) Field of Classification Search
CPC .............................................. H01L 21/67766
USPC ........................................ 414/744.3, 744.7
See application file for complete search history.

(56) References Cited

U.S. PATENT DOCUMENTS

| | | | |
|---|---|---|---|
| 5,149,029 A | * | 9/1992 | Smith .......................... 248/124.2 |
| 6,037,733 A | * | 3/2000 | Genov et al. ............. 318/568.11 |
| 6,601,468 B2 | | 8/2003 | Grover et al. |
| 8,272,830 B2 | * | 9/2012 | Kurita et al. ................ 414/749.5 |
| 2003/0044261 A1 | * | 3/2003 | Bonora et al. .............. 414/217.1 |
| 2003/0110878 A1 | | 6/2003 | Wakabayashi et al. |
| 2005/0191155 A1 | | 9/2005 | Sakiya |
| 2006/0018736 A1 | | 1/2006 | Lee et al. |
| 2008/0025824 A1 | | 1/2008 | Hashimoto |

(Continued)

FOREIGN PATENT DOCUMENTS

| | | |
|---|---|---|
| JP | H6-169003 A | 6/1994 |
| JP | H8-158790 A | 6/1996 |
| JP | 2000-167792 A | 6/2000 |

(Continued)

OTHER PUBLICATIONS

Chinese Office Action corresponding to Chinese Application No. 201210321770.7, dated Jul. 3, 2014.

(Continued)

*Primary Examiner* — Scott Lowe
(74) *Attorney, Agent, or Firm* — Bacon & Thomas, PLLC

(57) ABSTRACT

A transfer robot includes an arm unit having a hand capable of holding one of transferred objects, a base unit mounted to an installation frame and horizontally rotatably supporting the arm unit, an attachment member for attaching the base unit to the installation frame, and an elevation mechanism arranged within the base unit and provided with an elevation member linked to the arm unit. The elevation mechanism is configured to move the arm unit up and down within an arm-unit up/down movement range defined above the base unit by moving the elevation member up and down along a vertical shaft. The base unit is fixed to the installation frame in a state that a portion of the base unit extending by a specified height from a bottom wall of the base unit to the attachment member is embedded in the base receiving recess of the installation frame.

5 Claims, 3 Drawing Sheets

(56) References Cited

U.S. PATENT DOCUMENTS

2010/0111648 A1* 5/2010 Tamura et al. ............... 414/217
2012/0240710 A1* 9/2012 Yokoyama ............... 74/490.05

FOREIGN PATENT DOCUMENTS

| | | |
|---|---|---|
| JP | 2004-14635 A | 1/2004 |
| JP | 2008-103755 | 5/2008 |
| KR | 10-2006-0000546 A | 1/2006 |

OTHER PUBLICATIONS

Korean Office Action corresponding to Korean Application No. 10-2012-0098023, dated Aug. 11, 2014, with English translation.
Taiwanese Office Action dated Dec. 26, 2014 issued in corresponding Taiwanese application No. 101132168 and English translation thereof.
Japanese Office Action dated Apr. 14, 2015 issued in corresponding Japanese application No. 2013-185853 and English translation thereof.

* cited by examiner

TRANSFER ROBOT AND SUBSTRATE PROCESSING APPARATUS

CROSS-REFERENCE TO RELATED APPLICATION

This present application claims priority to Japanese Patent Application No. 2011-209876 filed on Sep. 26, 2011, the entire contents of which are incorporated herein by reference.

BACKGROUND OF THE INVENTION

1. Field of the Invention

An embodiment disclosed herein relates to a transfer robot and a substrate processing apparatus.

2. Description of the Related Art

In the past, a transfer robot arranged within a housing called an EFEM (Equipment Front End Module) is known as one example of horizontal articulated transfer robots for transferring a substrate such as a semiconductor wafer or a liquid crystal panel (see, e.g., Japanese Patent Application Publication No. 2008-103755).

The EFEM is a module provided at the front surface side of the semiconductor processing apparatus. In a locally cleaned atmosphere, the EFEM can deliver a substrate between a substrate supplying unit and a substrate processing unit through the use of a transfer robot.

In general, the transfer robot includes an arm unit having a hand capable of holding a transferred object, a base unit for horizontally rotatably supporting the arm unit and an elevation mechanism for moving the arm unit up and down by raising or lowering the elevation member connected to the arm unit along a vertical shaft arranged within the base unit.

SUMMARY OF THE INVENTION

In accordance with an aspect of the present invention, there is provided a transfer robot, including: an arm unit having a hand capable of holding one of transferred objects; a base unit mounted to an installation frame, the base unit horizontally rotatably supporting the arm unit; an attachment member configured to attach the base unit to the installation frame; and an elevation mechanism arranged within the base unit and provided with an elevation member linked to the arm unit, the elevation mechanism being configured to move the arm unit up and down within an arm-unit up/down movement range defined above the base unit by moving the elevation member up and down along a vertical shaft installed upright within the base unit, wherein the base unit is fixed to the installation frame in a state that a portion of the base unit extending by a specified height from a bottom wall of the base unit to the attachment member is embedded in the base receiving recess of the installation frame.

BRIEF DESCRIPTION OF THE DRAWINGS

The objects and features of the present disclosure will become apparent from the following description of an embodiment, given in conjunction with the accompanying drawings, in which.

DESCRIPTION OF THE EMBODIMENTS

An embodiment of a transfer robot and a substrate processing apparatus disclosed herein will now be described in detail with reference to the accompanying drawings which form a part hereof. However, the present invention is not limited to the embodiment to be described below.

(Substrate Processing Apparatus)

Figure 1:
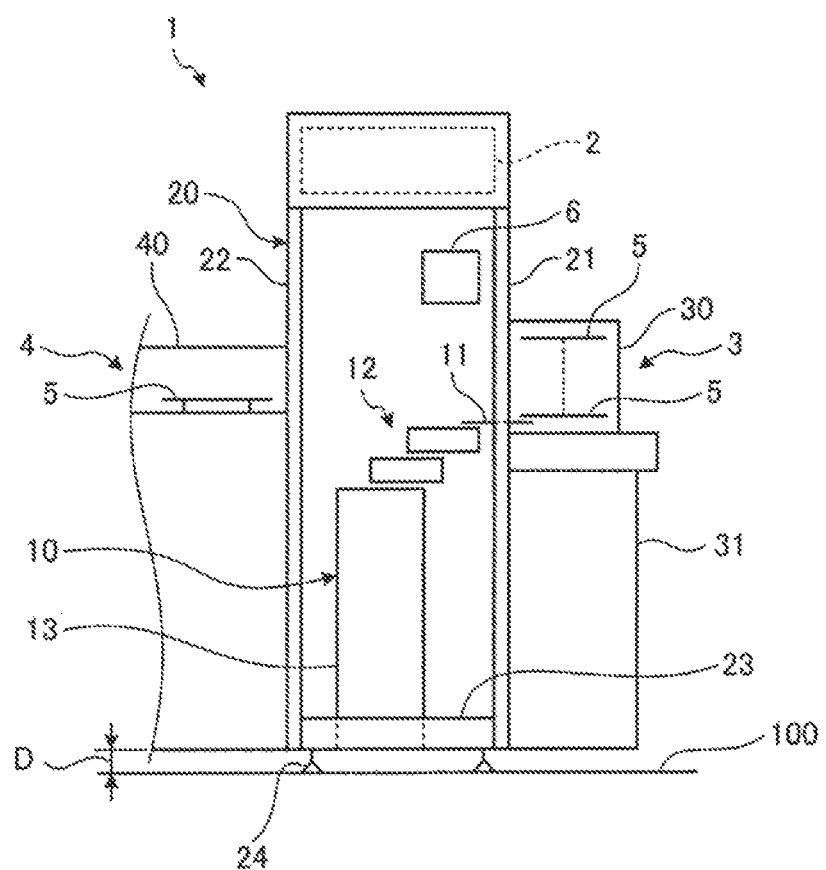
FIG. 1 is a schematic explanatory view showing a substrate processing apparatus provided with a transfer robot according to an embodiment.

First, description will be made on a substrate processing apparatus 1 according to an embodiment. FIG. 1 is a schematic explanatory view showing a substrate processing apparatus 1 provided with a transfer robot 10 according to an embodiment.

As shown in FIG. 1, the substrate processing apparatus 1 includes a transfer robot 10, a housing 20 for accommodating the transfer robot 10 in the substantially central region thereof, a substrate supplying unit 3 provided near one side surface 21 of the housing 20 and a substrate processing unit 4 provided near the other side surface 22 of the housing 20. In FIG. 1, reference numeral '100' designates a floor surface on which the substrate processing apparatus 1 is installed.

A filter 2 for purifying a gas is provided on the housing 20. The housing 20 is a so-called EFEM (Equipment Front End Module) capable of keeping the internal space thereof clean by isolating the down-flowing clean gas purified by the filter 2 from the outside. Legs 24 for supporting the housing 20 in a state that the housing 20 is spaced apart from the floor surface 100 by a specified distance D (e.g., 100 mm) are provided on the lower surface of an installation frame 23 serving as a bottom wall portion of the housing 20.

The transfer robot 10 includes an arm unit 12 provided with a hand 11 capable of holding a transferred object, e.g., a substrate 5 such as a semiconductor wafer or a liquid crystal panel. The arm unit 12 is vertically movably and horizontally rotatably supported on a base unit 13 installed on the installation frame 23 serving as the bottom wall portion of the housing 20. The transfer robot 10 will be described in more detail later.

The substrate supplying unit 3 includes a box-shaped cassette 30 for storing a plurality of substrates 5 in multiple stage along the height direction and a cassette opener (not shown) for opening a lid of the cassette 30 so that the substrates 5 can be taken out into the housing 20. The set of the cassette 30 and the cassette opener is placed on a table 31 having a specified height and is arranged in a spaced-apart relationship with one surface 21 of the housing 20.

On the other hand, the substrate processing unit 4 is designed to perform specified processing, e.g., chemical vapor deposition, etching or exposing, with respect to the substrates 5. The substrate processing unit 4 of the substrate processing apparatus 1 according to the present embodiment includes a necessary processing device 40 arranged near the other surface 22 of the housing 20 in an opposing relationship with the substrate supplying unit 3.

In this manner, the substrate supplying unit 3 and the substrate processing unit 4 are arranged in a mutually-opposing relationship across the transfer robot 10.

An aligner device 6 is provided within the housing 20. The aligner device 6 is positioned higher than the cassette 30 of the substrate supplying unit 3 and the processing device 40 of the substrate processing unit 4.

With this configuration, the transfer robot 10 of the substrate processing apparatus 1 can transfer the substrate 5 placed on the hand 11 to a desired position by moving the arm unit 12 upward from the base unit 13 or rotating the arm unit 12.

More specifically, the transfer robot 10 according to the present embodiment takes out the substrate 5 from the cassette 30 and transfers the substrate 5 to the aligner device 6. The substrate 5 is aligned by the aligner device 6. Thereafter, the substrate 5 thus aligned is transferred to the processing device 40. The substrate 5 processed in the processing device 40 is stored into the cassette 30 again.

(Transfer Robot)

Figure 2:
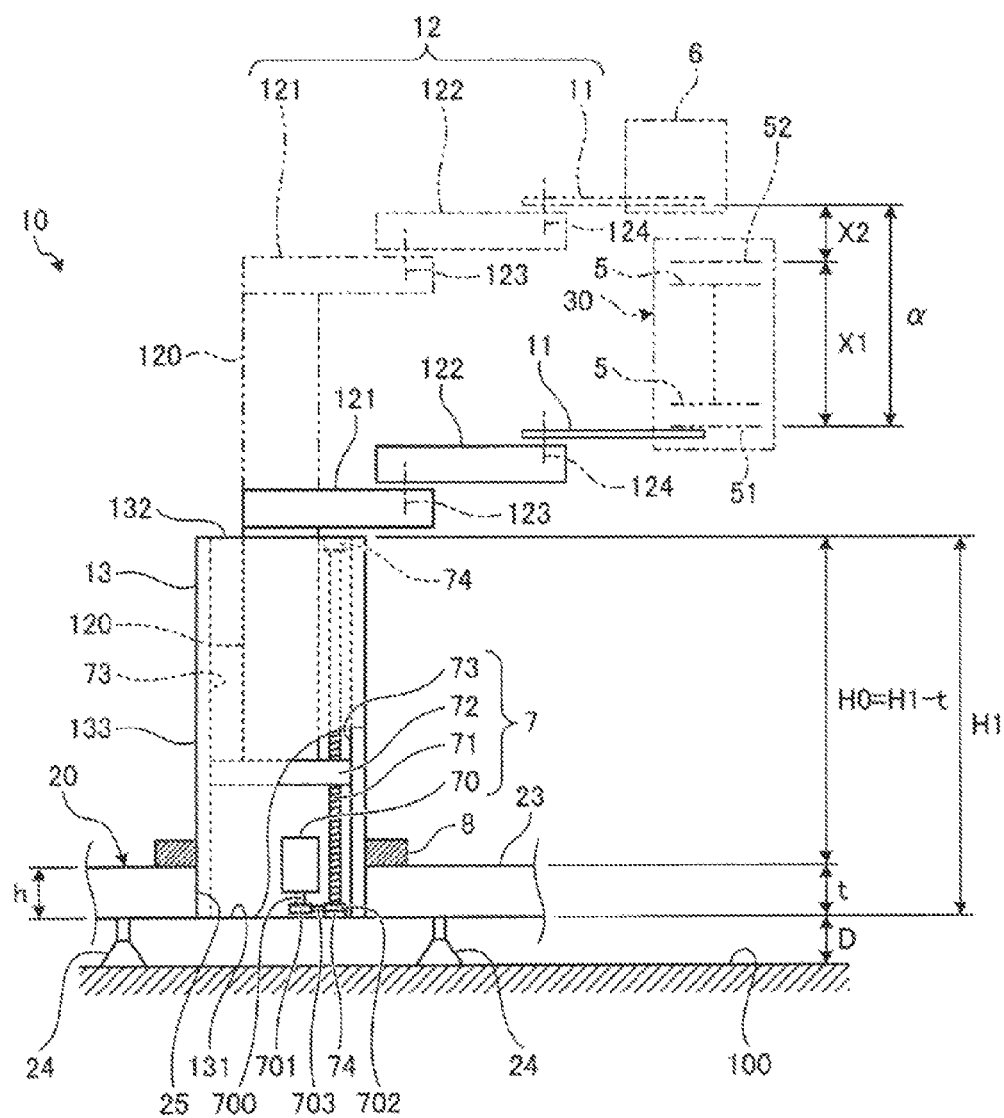
FIG. 2 is a schematic explanatory view of the transfer robot according to an embodiment.
Figure 3:
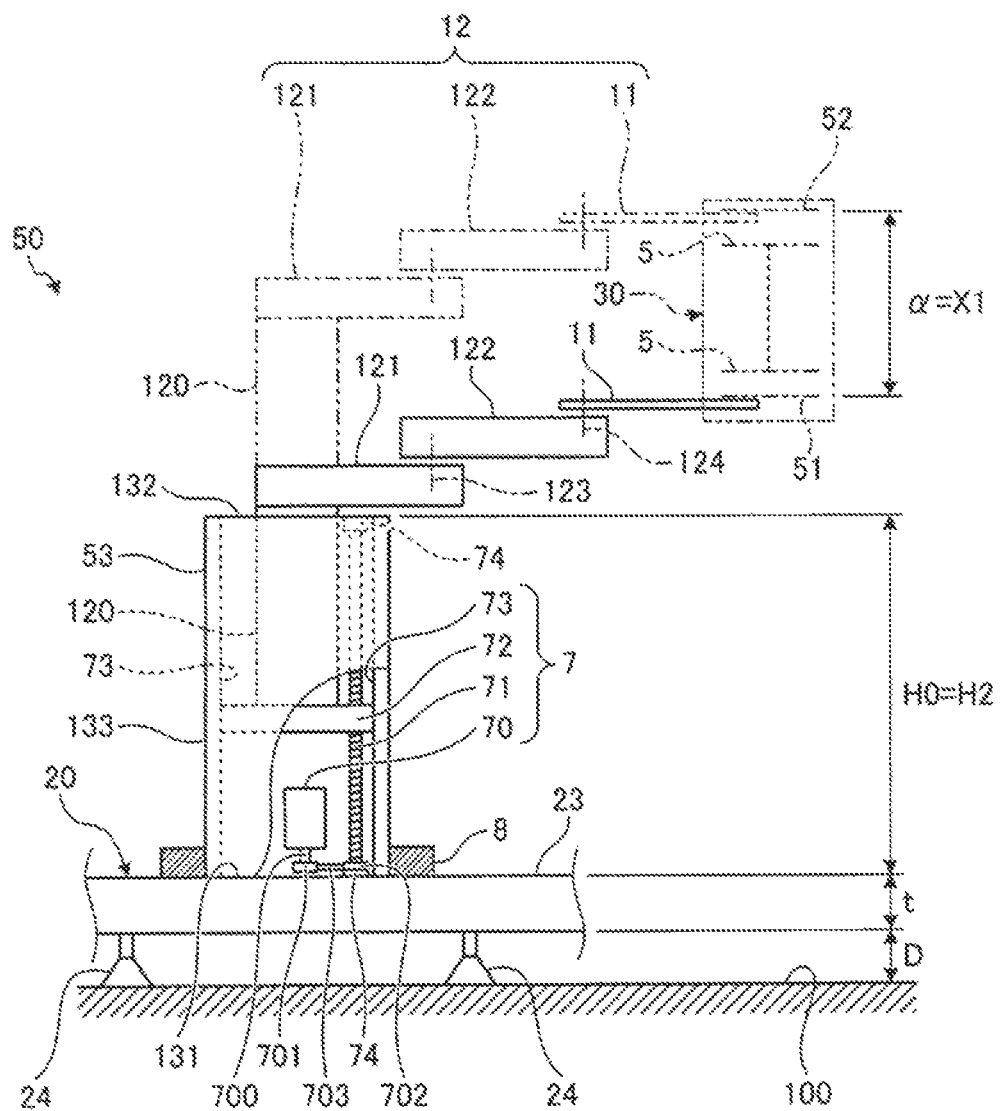
FIG. 3 is a schematic explanatory view of a transfer robot according to a comparative example.

The transfer robot 10 according to the present embodiment will now be described in more detail with reference to FIGS. 2 and 3. FIG. 2 is a schematic explanatory view of the transfer robot 10 according to an embodiment. FIG. 3 is a schematic explanatory view of a transfer robot 50 according to a comparative example.

The transfer robot 50 of the comparative example shown in FIG. 3 differs from the transfer robot 10 of the present embodiment in terms of the height of a base unit 53 and the attachment position of a fixing flange 8. However, the transfer robot 50 of the comparative example is functionally the same as the transfer robot 10 of the present embodiment. In FIG. 3, the same components as those of the transfer robot 10 of the present embodiment (except the base unit 13) are designated by the same reference symbols as used in FIG. 2. No detailed description will be made on the transfer robot 50 of the comparative example.

As shown in FIG. 2, the transfer robot 10 includes the arm unit 12 provided with the hand 11 capable of holding the substrate 5 as stated above. The arm unit 12 includes a first arm 121 whose base end portion is connected to a connecting body 120, a second arm 122 whose base end portion is connected to the tip end portion of the first arm 121 and a hand 11 whose base end portion is connected to the tip end portion of the second arm 122.

In the transfer robot 10 of the present embodiment shown in FIG. 2, the hand 11 has a structure capable of supporting the substrate 5 in a transferrable state. While not shown in the drawings, the hand 11 may have other structures capable of holding a transferred object, e.g., a structure capable of attracting the substrate 5 or a structure capable of gripping or sandwiching the substrate 5.

The first arm 121 is horizontally rotatably connected to the upper end of the connecting body 120 through a rotating shaft not shown in FIG. 2. The connecting body 120 can be moved up and down by an elevation mechanism 7 to be described later. The second arm 122 is rotatably connected to the tip end portion of the first arm 121 through a first rotating shaft 123 extending in the vertical direction. The hand 11 is rotatably connected to the tip end portion of the second arm 122 through a second rotating shaft 124 extending in the vertical direction.

The transfer robot 10 further includes a base unit 13 configured to horizontally rotatably support the arm unit 12 and installed on the installation frame 23 serving as the bottom wall portion of the housing 20, and an elevation mechanism 7 arranged within the base unit 13. The elevation mechanism 7 will be described in detail later.

The base unit 13 is formed in to a box shape by a bottom wall 131, a top wall 132 and a side wall 133. In the present embodiment, the external shape of the base unit 13 is rectangular when seen in a plan view. However, the external shape of the base unit 13 is not necessarily limited so the rectangular shape but may be a polygonal shape or a circular shape.

The elevation mechanism 7 arranged within the base unit 13 includes a motor 70 as a drive power source and a screw rod 71 as a vertical shaft installed upright within the base unit 13. As shown in FIG. 2, the motor 70 and the screw rod 71 are operatively connected to each other through a first pulley 701 attached to a motor shaft 700, a second pulley 702 attached to the lower end of the screw rod 71 and a power-transmitting belt 703 wound around the first pulley 701 and the second pulley 702.

The elevation mechanism 7 further includes an elevation member 72 linked to the connecting body 120 of the arm unit 12 and threadedly coupled to the screw rod 71, and a pair of linear guides 73 for guiding the up/down movement of the elevation member 72. The linear guides 73 extend vertically from the bottom wall 131 to the top wall 132 of the base unit 13 along the side wall 133 in a mutually-opposing relationship.

With the elevation mechanism 7 configured as above, if the screw rod 71 is rotated by the motor 70, the elevation member 72 is linearly moved up and down along the screw rod 71 within a specified up/down movement range. Thus the arm unit 12 is moved up and down within an arm-unit up/down movement range α defined above the base unit 13. In this regard, the up/down movement range of the elevation member 72 within the base unit 13 is set substantially equal to the arm-unit up/down movement range α defined above the base unit 13. In view of the height deviation occurring in the installation process and for the purpose of delivery of the substrate 5, it is required that the transfer robot 10 be able to gain access to the substrate 5 with a tolerance left in the vertical direction. In reality, therefore, the up/down movement range of the elevation member 72 within the base unit 13 is set a little larger than the arm-unit up/down movement range α.

The lower end of the screw rod 71 is rotatably supported on the bottom wall 131 of the base unit 13 through a lower bearing 74 and the upper end of the screw rod 71 is rotatably supported on the top wall 132 of the base unit 13 through an upper bearing 74. However, the support positions of the screw rod 71 are not limited to the bottom wall 131 and the top wall 132.

A thread portion is formed on the screw rod 71 over such an extent that the elevation member 72 can be moved up and down within a specified up/down movement range. The screw rod 71 may be arranged between the bottom wall 131 and the top wall 132 through the use of brackets or the like.

For example, a ball screw shaft may preferably be used as the screw rod 71 in the present embodiment. A ball screw nut may be provided in the elevation member 72.

In the configuration described above, as shown in FIG. 2, the base unit 13 is provided with a fixing flange 8 as a base attachment portion. The fixing flange 8 is arranged on the side wall 133 of the base unit 13 in a position spaced apart by a specified height h from the bottom wall 131.

A base receiving recess 25 is formed in the installation frame 23 of the housing 20. The base unit 13 is fixed to the installation frame 23 in a state that the portion of the base unit 13 extending from the bottom wall 131 to the lower end of the fixing flange 8 is embedded in the base receiving recess 25. While not shown in FIG. 2, bolt insertion holes are formed in the fixing flange 8. The fixing flange 8 and the installation frame 23 are connected and fixed to each other by bolts inserted through the bolt insertion holes.

In the substrate processing apparatus 1, the base unit height H0 is prescribed in advance such that the hand 11 of the transfer robot 10 arranged within the housing 20 can gain access to the substrate 5 stored in the lowermost stage within the cassette 30. In this regard, the base unit height H0 denotes the height from the upper surface of the installation frame 23 to the to wall 132 of the base unit 13.

In order for the hand 11 to reach the aligner device 6, the arm-unit up/down movement, range α needs to be larger than a first up/down movement range X1 which is defined by the clearance between the substrate 51 positioned in the lowermost stage of the cassette 30 and the substrate 52 positioned in the uppermost stage of the cassette 30. In other words, the arm-unit up/down movement range α needs to be set larger than the first up/down movement range X1 by a specified length.

In this regard, the specified length denotes the dimension from the uppermost substrate 52 to a specified elevation. In other words, the specified length refers to the clearance corresponding to a second up/down movement range X2 defined between the uppermost substrate 52 and the aligner device 6 arranged above the uppermost substrate 52.

In the transfer robot 10 of the present embodiment, therefore, the length H1 of the base unit 13 is increased by the length corresponding to the second up/down movement range X2 so that the second up/down movement range X2 can be included in the arm-unit up/down movement range α.

By increasing the stature of the base unit 13 by the length corresponding to the second up/down movement range X2, it is possible to expand the up/down movement range of the elevation member 72 within the base unit 13 by an amount corresponding the increase in the stature of the base unit 13.

The length corresponding to the second up/down movement range X2 thus expanded is set equal to the installation height of the fixing flange 8, whereby the increase in the height of the base unit 13 is absorbed by the thickness "t" of the installation frame 23.

In the present embodiment, as shown in FIG. 2, the specified height "h" from the bottom wall 131, namely the attachment height of the fixing flange 8, is set equal to the thickness "t" of the installation frame 23. Therefore, the rear surface of the bottom wall 131 of the base unit 13 is substantially flush with the rear surface of the installation frame 23.

In this manner, the length H1 of the base unit 13 of the transfer robot 10 according no the present embodiment is set larger than the base unit height H0 (the height from the upper surface of the installation frame 23 to the top wall 132 of the base unit 13). Nevertheless, the hand 11 of the arm unit 12 can smoothly gain access to the substrate 5 stored in the lowermost stage within the cassette 30 without interfering with the top wall 132 of the base unit 13.

Since the second up/down movement range X2 is included in the arm-unit up/down movement range α, the hand 11 of the arm unit 12 has no problem in reaching the aligner device 6.

Next, the configuration of the base unit 13 of the transfer robot 10 according to the present embodiment will be compared with that of the transfer robot 50 shown in FIG. 3. As shown in FIG. 3, the base unit 53 of the transfer robot 10 according to the comparative example includes a fixing flange 8 arranged at the lowermost end of the side wall 133. In other words, the base unit 53 is placed on the installation frame 23 of the housing 20 and is connected and fixed to the installation frame 23 in that state. The upper surface of the installation frame 23 makes contact with the rear surface of the bottom wall 131 of the base unit 53.

In the transfer robot 50 according to the comparative example, the length H2 of the base unit 53 has to be set equal to the base unit height H0 (the height from the upper surface of the installation frame 23 to the top wall 132 of the base unit 53).

Insofar as the aforementioned elevation mechanism 7 (see FIGS. 2 and 3) is employed, it is difficult in the transfer robot 50 of the comparative example to set the arm-unit up/down movement range α larger than the first up/down movement range X1. In the transfer robot 50 of the comparative example, as shown in FIG. 3, the first up/down movement range X1 becomes the arm-unit up/down movement range α.

In the transfer robot 10 according to the present embodiment, however, the base unit 13 is fixed to the installation frame 23 in a state that the portion of the base unit 13 extending by a specified height "h" from the bottom wall 131 to the fixing flange 8 is embedded in the base receiving recess 25 of the installation frame 23.

Therefore, the hand 11 can reach the aligner device 6 positioned above the cassette 30 and can gain access to the substrate 51 positioned in the lowermost stage of the cassette 30 with no likelihood that the first arm 121 interferes with the top wall 132 of the base unit 13.

Since the base unit 13 is fixed to the installation frame 23 in an embedded state, it is possible to increase the fixing strength as compared with the case where the base unit 53 is placed on and fixed to the installation frame 23 as in the transfer robot 50 of the comparative example.

In addition, the arm-unit up/down movement range α is set to include the first up/down movement range X1 defined by the clearance between the substrate 51 positioned in the lowermost stage of the cassette 30 and the substrate 52 positioned in the uppermost stage of the cassette 30 and the second up/down movement range X2 defined by the clearance between the substrate 52 positioned in the uppermost stage of the cassette 30 and the position spaced apart upward by a specified distance from the substrate 52.

The specified height "h" from the bottom wall 131 to the fixing flange 8 is set in conformity with the second up/down movement range X2. Moreover, the specified height "h" is set to fall within the dimension corresponding to the thickness "t" of the installation frame 23. This eliminates the possibility that the bottom wall 131 of the base unit 13 protrudes downward beyond the installation frame 23.

Therefore, when the housing 20 is transported by a forklift truck or the like, there is no likelihood that the forks of the forklift truck collide with the bottom wall 131 of the base unit 13 even if the forks are inserted into below the installation frame 23.

In the transfer robot 10 according to the present embodiment, as shown in FIG. 2, the lower end of the thread portion of the ball screw shaft as the screw rod 71 is positioned within the extent of the thickness "t" of the installation frame 23. Likewise, the lower end of the up/down movement range of the elevation member 72 is positioned within the extent of the thickness "t" of the installation frame 23.

Accordingly, the up/down movement range of the elevation member 72 within the base unit 13 can be efficiently set in conformity with the arm-unit up/down movement range α while limiting the base unit height H0, i.e., the height from the upper surface of the installation frame 23 to the top wall 132 of the base unit 13.

Other new effects and other modified examples of the embodiment described above can be readily derived by those skilled in the art. For that reason, the broad aspect of the present invention is not limited to the specific disclosure and the representative embodiment shown and described above. Accordingly, the present invention can be modified in many different forms without departing from the spirit and scope of the general inventive concept defined by the appended claims and the equivalents thereof.

For example, the attachment height of the fixing flange 8, i.e., the specified height "h" from the bottom wall 131, need not be necessarily set equal to the thickness "t" of the installation frame 23, while the specified height "h" is set equal to the thickness "t" of the installation frame 23 in the embodiment described above. It is only necessary that the specified height "h" be set to fall within the thickness "t" of the installation frame 23. In other words, it is preferred that the bottom wall 131 of the base unit 13 does not protrude downward beyond the installation frame 23.

In respect of the structure of the elevation mechanism 7, as long as the elevation member 72 linked to the arm unit 12 can move up and down along the vertical shaft installed upright within the base unit 13, the vertical shaft need not be necessarily the screw rod 71 such as the ball screw shaft described above. As for the layout of the motor 70 and the structure for power transfer to the screw rod 71, it is not always necessary to use the pulley/belt combination (e.g., the first pulley 701, the second pulley 702 and the power-transmitting belt 703).

What is claimed is:

1. A transfer robot, comprising:
    an arm unit having a hand capable of holding one of transferred objects;
    a base unit mounted to an installation frame, the base unit horizontally rotatably supporting the arm unit;
    an attachment member configured to attach the base unit to the installation frame; and
    an elevation mechanism arranged within the base unit and provided with an elevation member linked to the arm unit, the elevation mechanism being configured to move the arm unit up and down within an arm-unit up/down movement range defined above the base unit by moving the elevation member up and down along a vertical shaft installed upright within the base unit,
    wherein the base unit is fixed so the installation frame in a state that a portion of the base unit extending by a predetermined height from a bottom wall of the base unit to the attachment member is embedded in a base receiving recess of the installation frame,
    wherein the attachment member is a fixing flange provided on a side surface of the base unit;
    wherein a lower end of an up/down movement range of the elevation member lies within the extent of a thickness of the installation frame; and
    wherein the vertical shaft includes a screw rod having a thread portion whose lower end lies within the extent of the thickness of the installation frame.

2. The robot of claim 1, wherein the transferred objects are arranged in multiple stages within a specified vertically-extending region, the arm-unit up/down movement range including a first up/down movement range defined by a clearance between the transferred object positioned in a lowermost stage within the predetermined region and the transferred object position in an uppermost stage within the predetermined region and a second up/down movement range defined by a clearance between the transferred object positioned in the uppermost stage and the position spaced apart upward by a specified distance from the transferred object positioned in the uppermost stage, the specified height from the bottom wall of the base unit to the attachment member being set in conformity with the second up/down movement range.

3. The robot of claim 1, wherein the specified height from the bottom wall of the base unit to the attachment member is set to fall within the thickness of the installation frame.

4. The robot of claim 1, wherein the installation frame makes up a bottom wall of a housing provided at a top end thereof with a filter for purifying a gas, the housing being capable of keeping an internal space thereof clean by isolating a down-flowing clean gas purified by the filter from the outside.

5. A substrate processing apparatus, comprising:
    the transfer robot of claim 1;
    a substrate supplying unit arranged near one side surface of a housing within which the transfer robot is arranged; and
    a substrate processing unit provided near the other side surface of the housing and arranged in an opposing relationship with the substrate supplying unit across the transfer robot.

* * * * *